(12) United States Patent
Taniguchi et al.

(10) Patent No.: US 9,184,725 B2
(45) Date of Patent: Nov. 10, 2015

(54) ACOUSTIC WAVE DEVICE

(75) Inventors: Shinji Taniguchi, Tokyo (JP); Tokihiro Nishihara, Tokyo (JP); Masanori Ueda, Tokyo (JP); Tsuyoshi Yokoyama, Tokyo (JP); Takeshi Sakashita, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 366 days.

(21) Appl. No.: 13/556,865

(22) Filed: Jul. 24, 2012

(65) Prior Publication Data

US 2013/0038405 A1 Feb. 14, 2013

(30) Foreign Application Priority Data

Aug. 9, 2011 (JP) .................................. 2011-174290

(51) Int. Cl.
  *H03H 9/70* (2006.01)
  *H03H 9/54* (2006.01)
  *H03H 9/02* (2006.01)
  (Continued)

(52) U.S. Cl.
  CPC ....... *H03H 9/02102* (2013.01); *H03H 9/02118* (2013.01); *H03H 9/02157* (2013.01); *H03H 9/131* (2013.01); *H03H 9/132* (2013.01); *H03H 9/173* (2013.01); *H03H 3/04* (2013.01); *H03H 9/175* (2013.01); *H03H 9/564* (2013.01); *H03H 9/582* (2013.01); *H03H 9/706* (2013.01);
  (Continued)

(58) Field of Classification Search
  CPC .......... H03H 9/02157; H03H 9/02102; H03H 9/02118; H03H 9/131; H03H 9/132; H03H 9/173; H03H 9/175; H03H 9/205; H03H 9/564; H03H 9/582; H03H 9/706; H03H 2003/0442; H03H 2003/021; H03H 2003/0407; H03H 3/04

USPC .......... 333/187–192, 133; 310/322, 324, 334, 310/335, 346
See application file for complete search history.

(56) References Cited

U.S. PATENT DOCUMENTS 4,456,850 A 6/1984 Inoue et al.
6,441,539 B1 8/2002 Kitamura et al.
(Continued)

FOREIGN PATENT DOCUMENTS

CN 1767380 A 5/2006
CN 1805276 A 7/2006
(Continued)

OTHER PUBLICATIONS

H. Zhang et al.; "MIMO Multiplexer Based on Film Bulk Acoustic Resonator"; 2010 IEEE Transactions of Consumer Electronics; vol. 56, Iss. 2, pp. 805-810, May 2010, current version Jul. 2010.*
(Continued)

*Primary Examiner* — Barbara Summons
(74) *Attorney, Agent, or Firm* — Chen Yoshimura LLP (57) ABSTRACT

An acoustic wave device includes: a substrate; a lower electrode formed on the substrate; at least two piezoelectric films formed on the lower electrode; an insulating film located between the at least two piezoelectric films; and an upper electrode formed on the at least two piezoelectric films, wherein an outer periphery of an uppermost piezoelectric film out of the at least two piezoelectric films in a region in which the lower electrode and the upper electrode face each other is positioned further in than an outer periphery of the upper electrode.

9 Claims, 12 Drawing Sheets

(51) Int. Cl.
*H03H 9/13* (2006.01)
*H03H 9/17* (2006.01)
*H03H 3/04* (2006.01)
*H03H 9/56* (2006.01)
*H03H 9/58* (2006.01)
*H03H 3/02* (2006.01)

(52) U.S. Cl.
CPC .. *H03H2003/021* (2013.01); *H03H 2003/0407* (2013.01); *H03H 2003/0442* (2013.01)

(56) References Cited

U.S. PATENT DOCUMENTS

| | | | |
|---|---|---|---|
| 6,452,310 B1* | 9/2002 | Panasik | 310/334 |
| 7,545,077 B2* | 6/2009 | Taniguchi et al. | 310/320 |
| 7,567,023 B2* | 7/2009 | Iwaki et al. | 310/365 |
| 8,222,970 B2 | 7/2012 | Inoue et al. | |
| 2004/0196116 A1* | 10/2004 | Komuro et al. | 333/133 |
| 2005/0248232 A1 | 11/2005 | Itaya et al. | |
| 2005/0269904 A1* | 12/2005 | Oka | 310/324 |
| 2006/0028298 A1 | 2/2006 | Nakamura et al. | |
| 2006/0091764 A1 | 5/2006 | Tsutsumi et al. | |
| 2006/0152110 A1 | 7/2006 | Taniguchi et al. | |
| 2006/0255883 A1 | 11/2006 | Ebuchi | |
| 2007/0120625 A1* | 5/2007 | Larson et al. | 333/189 |
| 2007/0252476 A1 | 11/2007 | Iwaki et al. | |
| 2007/0296521 A1* | 12/2007 | Schmidhammer | 333/133 |
| 2008/0129417 A1* | 6/2008 | Taniguchi et al. | 333/192 |
| 2010/0019864 A1* | 1/2010 | Yokoyama et al. | 333/187 |
| 2010/0117762 A1 | 5/2010 | Taniguchi et al. | |
| 2010/0148636 A1* | 6/2010 | Nishihara et al. | 310/365 |
| 2010/0156554 A1* | 6/2010 | Nakamura et al. | 333/133 |
| 2010/0327701 A1* | 12/2010 | Grannen et al. | 310/346 |
| 2011/0102102 A1* | 5/2011 | Fujio et al. | 333/133 |
| 2011/0227671 A1* | 9/2011 | Zhang | 333/195 |
| 2011/0266925 A1* | 11/2011 | Ruby et al. | 310/346 |
| 2012/0319530 A1* | 12/2012 | Burak et al. | 310/321 |
| 2012/0319534 A1* | 12/2012 | Shirakawa et al. | 310/365 |
| 2013/0033337 A1 | 2/2013 | Nishihara et al. | |
| 2013/0106248 A1* | 5/2013 | Burak et al. | 310/360 |

FOREIGN PATENT DOCUMENTS

| | | | |
|---|---|---|---|
| CN | 101166020 A | | 4/2008 |
| CN | 102916674 A | | 2/2013 |
| JP | 58-137317 A | | 8/1983 |
| JP | 60-16010 A | | 1/1985 |
| JP | 2001-211053 A | | 8/2001 |
| JP | 2003-51732 A | | 2/2003 |
| JP | 2006-020277 | * | 1/2006 |
| JP | 2006-74749 A | | 3/2006 |
| JP | 2005-318365 A | | 11/2006 |
| JP | 2006-319796 A | | 11/2006 |
| JP | 2007-159123 A | | 6/2007 |
| JP | 2007-300430 A | | 11/2007 |
| JP | 2008-103798 A | | 5/2008 |
| JP | 2008-236795 A | | 10/2008 |
| JP | 2010-118951 A | | 5/2010 |
| JP | 2011-160232 | * | 8/2011 |

OTHER PUBLICATIONS

IEEE Xplore Digital Library Abstract page for article "MIMO Multiplxer Based on Film Bulk Acoustic Resonator" published May 2010, one page.*
English language machine translation of Oka et al. JP 2006-020277, published Jan. 19, 2006, 10 pages.*
Allah et al., "Temperature Compensated Solidly Mounted Resonators with thin $SiO_2$ layers", Proc. IEEE International Ultrasonics Symposium, 2009, pp. 859-862.
Chinese Office Action dated Nov. 24, 2014, in a counterpart Chinese patent application No. 201210282502.9.
Japanese Office Action dated Apr. 21, 2015, in a counterpart Japanese patent application No. 2011-174290.

* cited by examiner

ACOUSTIC WAVE DEVICE

CROSS-REFERENCE TO RELATED APPLICATION

This application is based upon and claims the benefit of priority of the prior Japanese Patent Application No. 2011-174290, filed on Aug. 9, 2011, the entire contents of which are incorporated herein by reference.

FIELD

A certain aspect of the present invention relates to an acoustic wave device, and relates to an acoustic wave device including a piezoelectric thin film resonator for example.

BACKGROUND

An acoustic wave device using a piezoelectric thin film resonator has been used as a filter for wireless devices and the like for example. A piezoelectric thin film resonator has a structure in which a lower electrode and an upper electrode face each other across a piezoelectric film. Filters and duplexers are examples of the acoustic wave device using a piezoelectric thin film resonator. In these acoustic wave devices, the resonance frequency, anti-resonance frequency, passband and the like change in accordance with a temperature. A technique in which an insulating film is provided in the piezoelectric film is known as a technique that compensates for these changes in accordance with a temperature as disclosed in Japanese Patent Application Publication No. 58-137317 and Proc. IEEE Ultrasonics Symposium 2009, pp 859-862 for example.

However, in the above technique, resonance characteristics of the acoustic wave device such as a Q-value and an electromechanical coupling coefficient are not sufficient.

SUMMARY OF THE INVENTION

According to an aspect of the present invention, there is provided an acoustic wave device including: a substrate; a lower electrode formed on the substrate; at least two piezoelectric films formed on the lower electrode; an insulating film located between the at least two piezoelectric films; and an upper electrode formed on the at least two piezoelectric films, wherein an outer periphery of an uppermost piezoelectric film out of the at least two piezoelectric films in a region in which the lower electrode and the upper electrode face each other is positioned further in than an outer periphery of the upper electrode.

According to another aspect of the present invention, there is provided another acoustic wave device including: a reception filter which outputs a balanced output by a longitudinally coupled double-mode surface acoustic wave filter; and a transmission filter in which acoustic wave resonators including at least one acoustic wave device mentioned above are connected in a ladder shape.

DETAILED DESCRIPTION

A description will now be given of embodiments of the present invention with reference to drawings.

First Embodiment

Figure 1A:
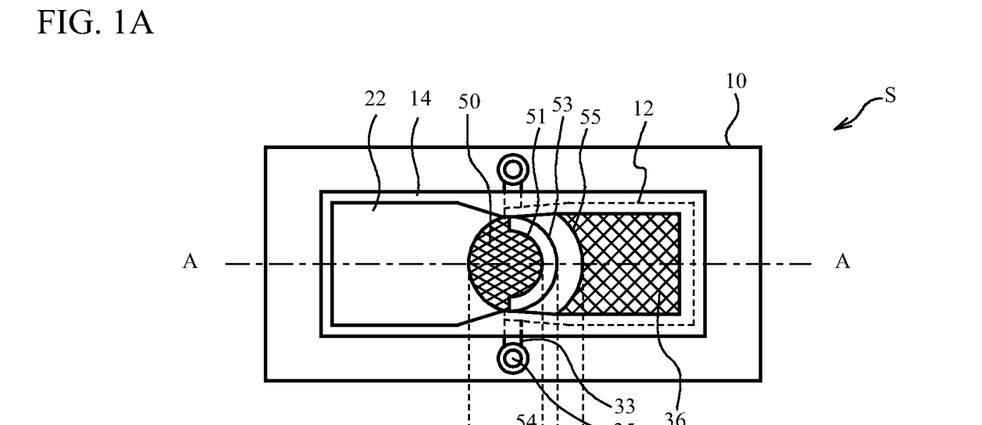
FIG. 1A is a plain view of a piezoelectric thin film resonator in accordance with a first embodiment.
Figure 1B:
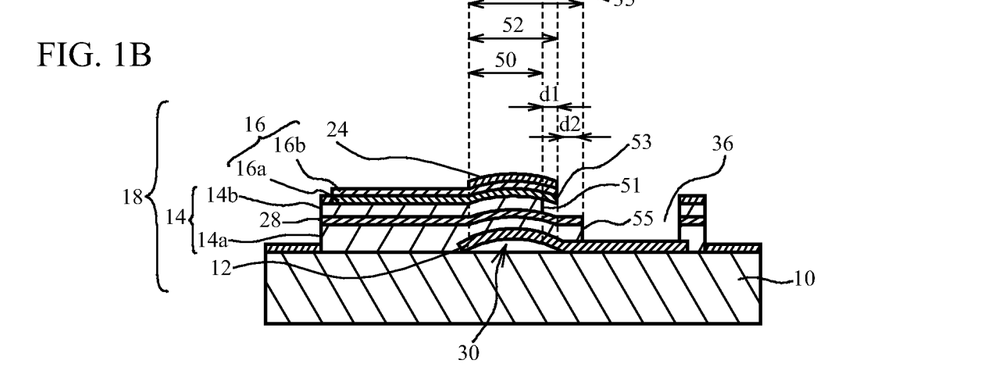
FIG. 1B and FIG. 1C are cross-sectional views taken along line A-A in FIG. 1A.
Figure 1C:
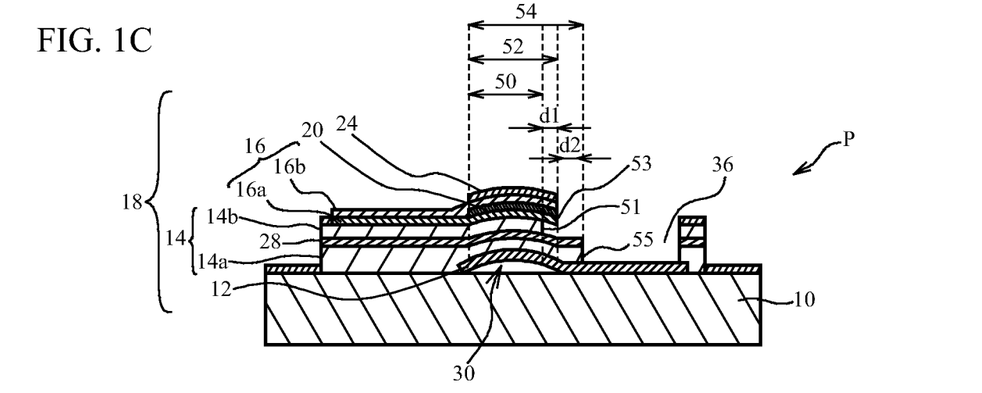

A first embodiment is an example of a resonator used in an acoustic wave device. FIG. 1A is a plain view of a piezoelectric thin film resonator in accordance with a first embodiment, and FIG. 1B and FIG. 1C are cross-sectional views taken along line A-A of FIG. 1A. FIG. 1B illustrates a cross-sectional view of a series resonator of a ladder-type filter for example, and FIG. 1C illustrates a cross-sectional view of a parallel resonator of a ladder-type filter for example.

Referring to FIG. 1A and FIG. 1B, a description will be given of a structure of a series resonator S. A lower electrode 12 is located on a substrate 10 which is an Si substrate so that a space 30, which has a dome-shaped bulge on the lower electrode 12 side, is formed between the lower electrode 12 and a flat principal surface of the substrate 10. The dome-shaped bulge is a bulge having a shape where the height of the space 30 is low near the periphery of the space 30 and the height of the space 30 becomes higher at the position closer to the center of the space 30. The lower electrode 12 includes a Cr (chrome) layer and a Ru (ruthenium) layer located on the Cr layer.

A piezoelectric film 14 made of aluminum nitride (AlN) having a main axis of (002) direction is located on the lower electrode 12. The piezoelectric film 14 includes at least two piezoelectric films 14a and 14b. For example, an insulating film 28 made of an oxide silicon film is located between at least two piezoelectric films 14a and 14b. In the first embodiment, a description will be given of a case where at least two piezoelectric films 14a and 14b are two piezoelectric films, and the insulating film 28 is one insulating film.

An upper electrode 16 is located on the piezoelectric film 14 so as to have a region in which the upper electrode 16 faces the lower electrode 12 across the piezoelectric film 14 (a resonance region 50). The upper electrode 16 includes a Ru layer 16a and a Cr layer 16b located on the Ru layer 16a.

An oxide silicon film is formed on the upper electrode 16 as a frequency adjusting film 24. A multilayered film 18 includes the lower electrode 12, the piezoelectric film 14, the insulating film 28, the upper electrode 16 and the frequency adjusting film 24. The frequency adjusting film 24 may function as a passivation film.

As illustrated in FIG. 1A, an introduction path 33 for etching a sacrifice layer is formed in the lower electrode 12. The sacrifice layer is a layer used for forming the space 30. The vicinity of the end of the introduction path 33 is not covered with the piezoelectric film 14, and the lower electrode 12 has a hole portion 35 at the end of the introduction path 33. As illustrated in FIG. 1A and FIG. 1B, an aperture 36 for electrically connecting the lower electrode 12 is provided to the piezoelectric film 14. A foundation film for a bump such as Au for external connection may be provided on the lower electrode 12 located in the bottom of the aperture 36.

Referring to FIG. 1A and FIG. 1C, a description will be given of a structure of a parallel resonator P. Compared to the series resonator S, in the parallel resonator P, a mass load film 20 made of Ti (titanium) layer is located between the Ru layer 16a and the Cr layer 16b. Thus, the multilayered film 18 includes the mass load film 20 formed in the entire surface within the resonance region 50 in addition to the multilayered film of the series resonator S. Other structures are the same as those of the series resonator S illustrated in FIG. 1B, and a description will be omitted.

The difference between resonance frequencies of the series resonator S and the parallel resonator P is adjusted by using the film thickness of the mass load film 20. The adjustment of resonance frequencies of both the series resonator S and the parallel resonator P is executed by adjusting film thicknesses of respective frequency adjusting films 24.

As illustrated in FIG. 1A through FIG. 1C, in the first embodiment, in at least a part of the outer periphery of the resonance region 50, an outer periphery 51 of the piezoelectric film 14b in a region 52 where the lower electrode 12 and the upper electrode 16 face each other is positioned further in than an outer periphery 53 of the upper electrode 16 by a distance d1. In addition, in the region where the outer periphery 51 of the piezoelectric film 14b is formed further in than the outer periphery 53 of the upper electrode 16, an outer periphery 55 of the piezoelectric film 14a is positioned further out than the outer periphery 53 by a distance d2. The outer periphery of the insulating film 28 is almost the same as the outer periphery 55 of the piezoelectric film 14a. The resonance region 50 where the upper electrode 16 and the lower electrode 12 face each other across the piezoelectric film 14 becomes smaller by the distance d1. The resonance region 50 is a region where an acoustic wave in a thickness longitudinal oscillation mode resonates. A region 54 where the piezoelectric film 14a and the lower electrode 12 overlap each other becomes larger by the distance d2.

In a case of a piezoelectric thin film resonator having a resonance frequency of 2 GHz, the Cr layer of the lower electrode 12 has a film thickness of 100 nm, the Ru layer has a film thickness of 200 nm, and each of piezoelectric films 14a and 14b made of the AlN layer has a film thickness of 600 nm. The insulating film 28 made of an oxide silicon film has a film thickness of 25 nm. The Ru layer 16a has a film thickness of 230 nm, and the Cr layer 16b has a film thickness of 20 nm. The film thickness of each layer may be set arbitrarily to obtain the desired resonance frequency.

As the lower electrode 12 and the upper electrode 16, in addition to Cr and Ru, a metal single-layer film such as Al (aluminum), Cu (copper), Mo (molybdenum), W (tungsten), Ta (tantalum), Pt (platinum), Rh (rhodium) and Jr (iridium), or a composite film of these may be used. As the mass load film 20, in addition to Ti, a metal single-layer film such as Ru, Cr, Al, Cu, Mo, W, Ta, Pt, Rh and Jr or a composite film of these may be used. In addition, an insulating film made of metal nitride or metal oxide such as silicon nitride or oxide silicon may be used. In a case where the mass load film 20 is formed between layers of the lower electrode 12, between layers of the upper electrode 16, between the lower electrode 12 and the piezoelectric film 14, and between the piezoelectric film 14 and the upper electrode 16, it is preferable to use a metal film to lower a resistance.

As the substrate 10, in addition to the Si substrate, a fused silica substrate, a glass substrate, a ceramic substrate, a GaAs substrate or the like may be used. In addition to aluminum nitride, ZnO (zinc oxide), PZT (lead zirconate titanate), $PbTiO_3$ (lead titanate) or the like may be used for the piezoelectric film 14. In addition, the piezoelectric film 14 may be a film in which aluminum nitride is mainly included and to which other elements are added to improve resonance characteristics or improve temperature characteristics. In addition to the oxide silicon film ($SiO_2$), silicon nitride ($Si_3N_4$) may be used for the insulating film 28. In addition, the insulating film 28 may be a film in which oxide silicon or silicon nitride is mainly included and to which other elements are added to improve resonance characteristics or improve the dependence on temperature.

Figure 2A:
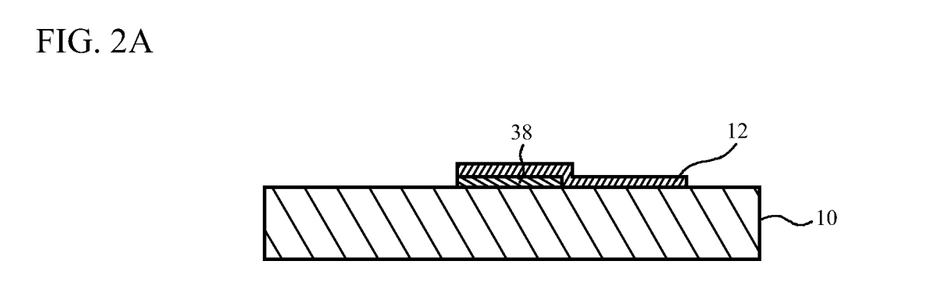
FIG. 2A through FIG. 2D are cross-sectional views illustrating a fabrication method of the resonator in accordance with the first embodiment.

FIG. 2A through FIG. 2D are cross-sectional views illustrating a fabrication method of the resonator in accordance with the first embodiment. As illustrated in FIG. 2A, a sacrifice layer 38 for forming a space on the substrate 10 which has a flat principal surface is formed. The sacrifice layer 38 has a film thickness of 10 to 100 nm for example, and is selected from materials such as MgO, ZnO, Ge and $SiO_2$ which can be easily dissolved by the etching liquid or the etching gas. Then, the sacrifice layer 38 is patterned into a desired shape by the photolithographic technique and the etching technique. Then, the lower electrode 12 is formed on the sacrifice layer 38 and the substrate 10. The sacrifice layer 38 and the lower electrode 12 are formed by the sputtering method, the vacuum evaporation method or the CVD (Chemical Vapor Deposition) method for example. After that, the lower electrode 12 is patterned into a desired shape by the photolithographic technique and the etching technique.

Figure 2B:
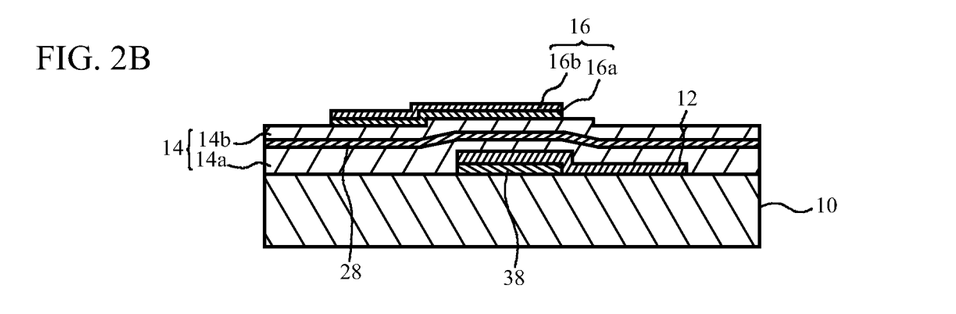

As illustrated in FIG. 2B, the piezoelectric film 14a, the insulating film 28, the piezoelectric film 14b and the upper electrode 16 are formed on the lower electrode 12 and the substrate 10 by the sputtering method, the vacuum evaporation method or the CVD method. The upper electrode 16 is patterned into a desired shape by the photolithographic technique and the etching technique.

Figure 2C:
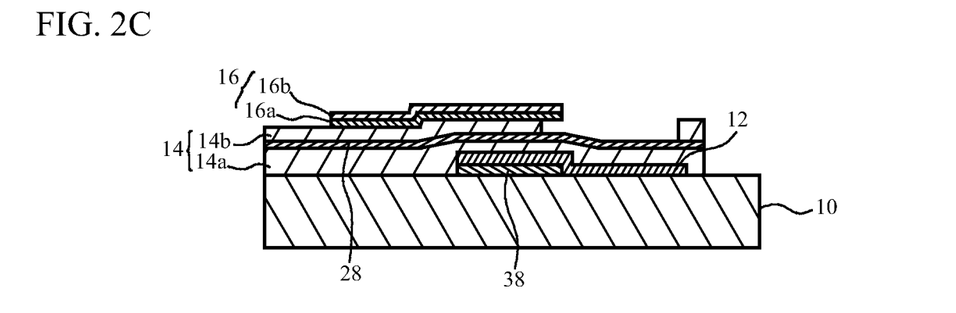

As illustrated in FIG. 2C, the piezoelectric film 14b is patterned into a desired shape by the photolithographic technique and the etching technique. The etching of the piezoelectric film 14b uses the solution including phosphoric acid for example, and is carried out so that at least a part of the outer periphery of the piezoelectric film 14b is positioned further in than the outer periphery of the upper electrode 16. The position of the outer periphery of the piezoelectric film 14b can be controlled by the etching time for example.

Figure 2D:
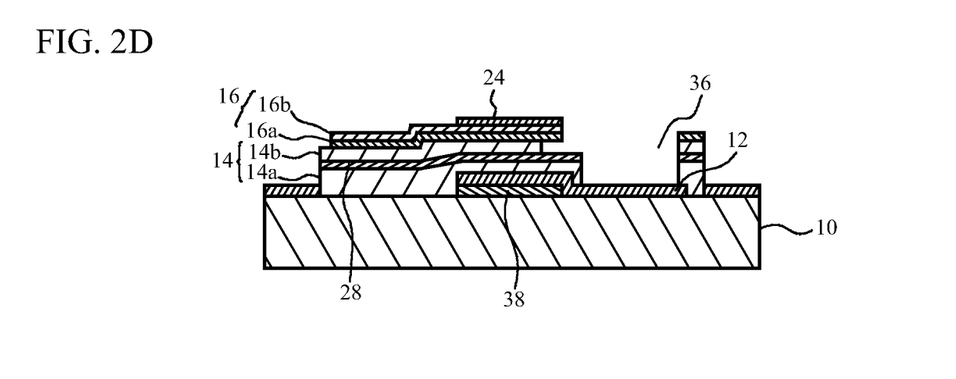

As illustrated in FIG. 2D, the frequency adjusting film 24 is formed by the sputtering method or the CVD method for example. The frequency adjusting film 24 is patterned into a desired shape by the photolithographic technique and the etching technique. Then, the insulating film 28 and the piezoelectric film 14a are patterned into a desired shape by the photolithographic technique and the etching technique. This exposes the lower electrode 12 to the aperture 36. Thus, a bump such as Au can be electrically connected to the lower electrode 12 via the aperture 36.

After that, the etching liquid of the sacrifice layer 38 is introduced into the sacrifice layer 38 below the lower electrode 12 via the hole portion 35 and the introduction path 33 (see FIG. 1A). The sacrifice layer 38 is removed by this process. As the medium for etching the sacrifice layer 38, medium which do not etch materials constituting a resonator other than the sacrifice layer 38 is preferable. Especially, the etching medium is preferably the medium which do not etch the lower electrode 12 to which the etching medium contacts. The stress of the multilayered film 18 is set to be a compression stress. This makes the multilayered film 18 bulge out to the opposite side of the substrate 10 as if it departed away from the substrate 10, when the sacrifice layer 38 is removed. The space 30 having a dome-shaped bulge is formed between the lower electrode 12 and the substrate 10. By processes described above, the series resonator S illustrated in FIG. 1A and FIG. 1B is completed. The parallel resonator P illustrated in FIG. 1C is made by forming the mass load film 20 between the Ru layer 16a and the Cr layer 16b in FIG. 2B.

Figure 3:
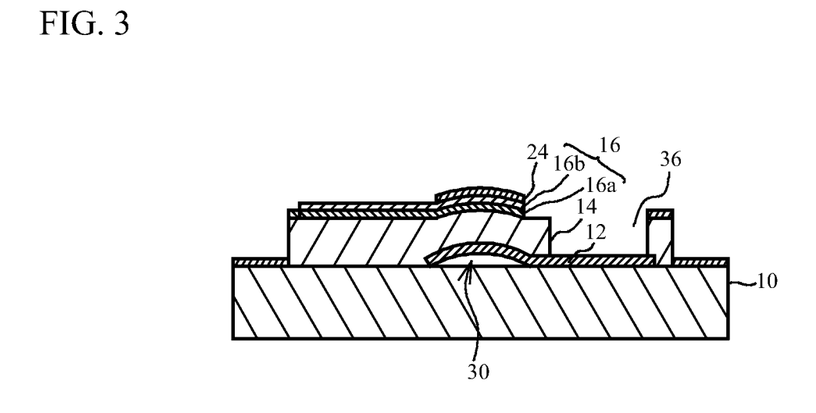
FIG. 3 is a cross-sectional view of a resonator in accordance with a first comparative example.

Temperature dependencies of the resonance frequency and the anti-resonance frequency of the resonator in accordance with the first embodiment are measured. For a comparison, a resonator in accordance with a first comparative example is made. FIG. 3 is a cross-sectional view of the resonator in accordance with the first comparative example. Compared to FIG. 1B of the first embodiment, the insulating film 28 is not formed. The outer periphery of the piezoelectric film 14 is positioned further out than the outer periphery of the upper electrode 16. Other structures are the same as those illustrated in FIG. 1B of the first embodiment, and a description will be omitted. In the first embodiment, film thicknesses and materials are the same as those exemplified in FIG. 1A and FIG. 1B. The region 52 where the upper electrode 16 and the lower electrode 12 face each other has an elliptical shape, and the major axis has a length of 175 μm and the minor axis has a length of 110 μm. The distance d1 is 0.2 μm, and d2 is 5 μm. In the first comparative example, the shape and size of the region where the upper electrode 16 and the lower electrode 12 face each other are the same as those of the first embodiment.

Figure 4A:
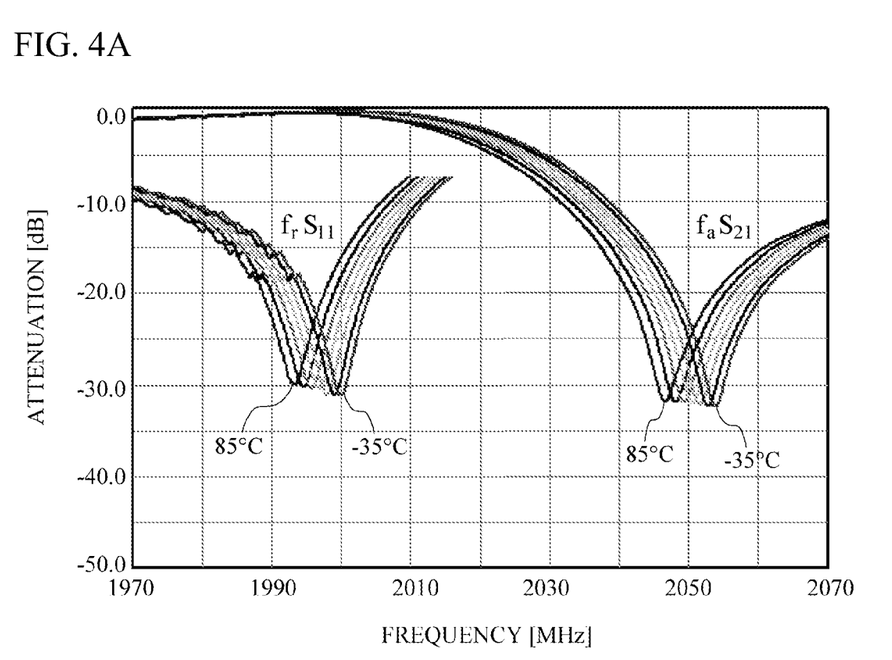
FIG. 4A and FIG. 4B are diagrams illustrating temperature dependencies of resonance frequencies and anti-resonance frequencies of the first comparative example and the first embodiment respectively.
Figure 4B:
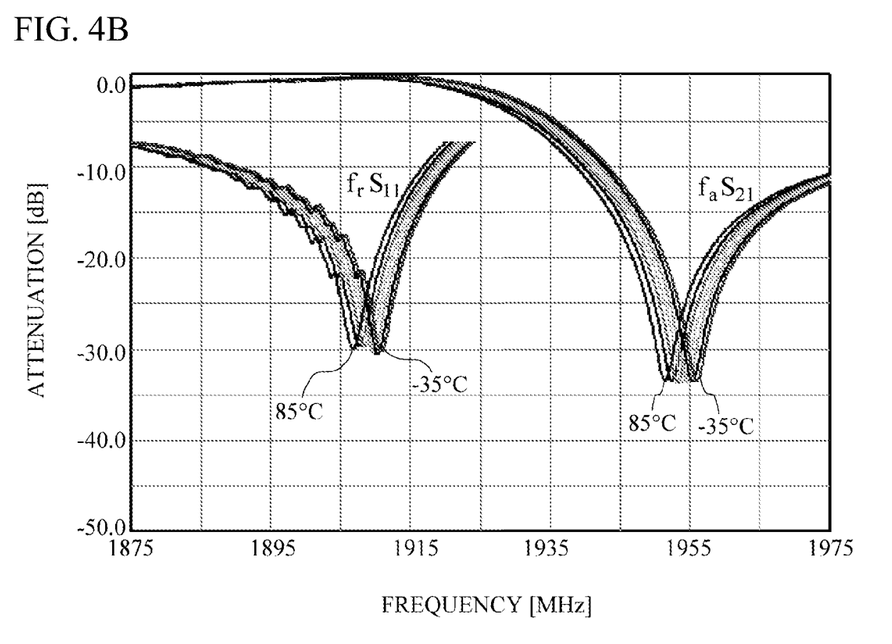

FIG. 4A and FIG. 4B are diagrams illustrating temperature dependencies of resonance frequencies and anti-resonance frequencies of the first comparative example and the first embodiment respectively. The resonance frequency fr is acquired by measuring the reflection characteristics S11 of the resonator. The anti-resonance frequency fa is acquired by measuring the pass characteristics S21 of the resonator. FIG. 4A and FIG. 4B show measurement results of S11 and S21 of the resonator measured under the temperature from −35° C. to 85° C. at an interval of 20° C. According to FIG. 4A and FIG. 4B, temperature coefficients of resonance frequencies and anti-resonance frequencies of the first comparative example and the first embodiment are as follows.

The First Comparative Example

| Temperature coefficient of the resonance frequency | −29.6 ppm/° C. |
| --- | --- |
| Temperature coefficient of the anti-resonance frequency | −31.0 ppm/° C. |

The First Embodiment

| Temperature coefficient of the resonance frequency | −18.3 ppm/° C. |
| --- | --- |
| Temperature coefficient of the anti-resonance frequency | −20.1 ppm/° C. |

As described above, in the first embodiment, the reason why the temperature coefficient of the frequency becomes small is that the temperature coefficient of the elastic constant of the piezoelectric film 14 is opposite in sign to that of the insulating film 28. As described above, it is possible to suppress temperature dependencies of the resonance frequency and the anti-resonance frequency by locating the insulating film 28 between piezoelectric films 14a and 14b.

Figure 5:
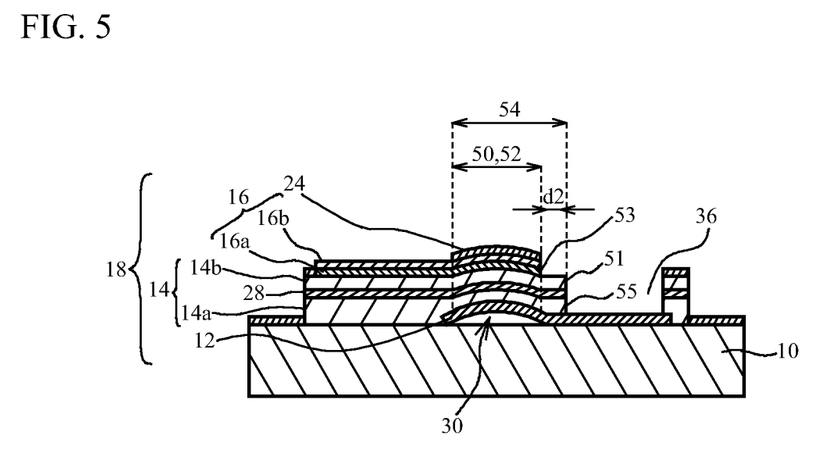
FIG. 5 is a cross-sectional view of a resonator in accordance with a second comparative example.

Next, resonance characteristics of the resonator in accordance with the first embodiment are simulated. For the comparison, a resonator in accordance with a second comparative example is assumed. FIG. 5 is a cross-sectional view of the resonator in accordance with the second comparative example. Compared to FIG. 1B of the first embodiment, the outer periphery 51 of the piezoelectric film 14b almost coincides with the outer periphery 55 of the piezoelectric film 14a. The outer periphery 51 of the piezoelectric film 14b and the outer periphery 55 of the piezoelectric film 14a are formed further out than the outer periphery 53 of the upper electrode 16 by the distance d2. Other structures are the same as those of FIG. 1B of the first embodiment, and the description is omitted. In the first embodiment, the distance d2 is assumed to be 5 μm, and the simulation is performed by changing the distance d1 from 0.2 μm to 1.5 μm at seven points. In the second comparative example, d2 is assumed to be 5 μm. Film thicknesses and materials are the same as those described in FIG. 1A and FIG. 1B.

Figure 6A:
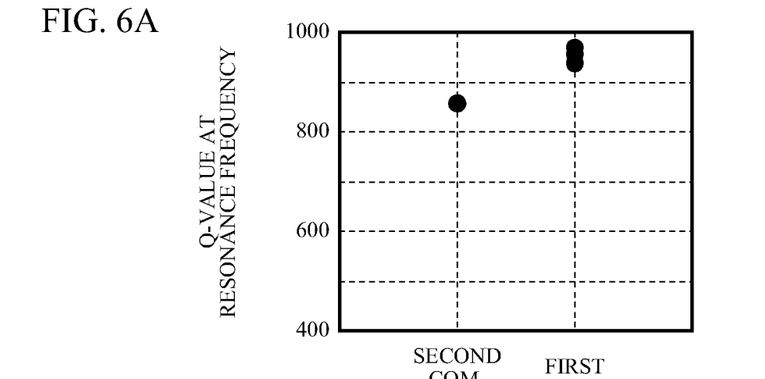
FIG. 6A through FIG. 6C are simulation results showing a Q-value at a resonance frequency, a Q-value at an anti-resonance frequency, and an electromechanical coupling coefficient respectively.
Figure 6B:
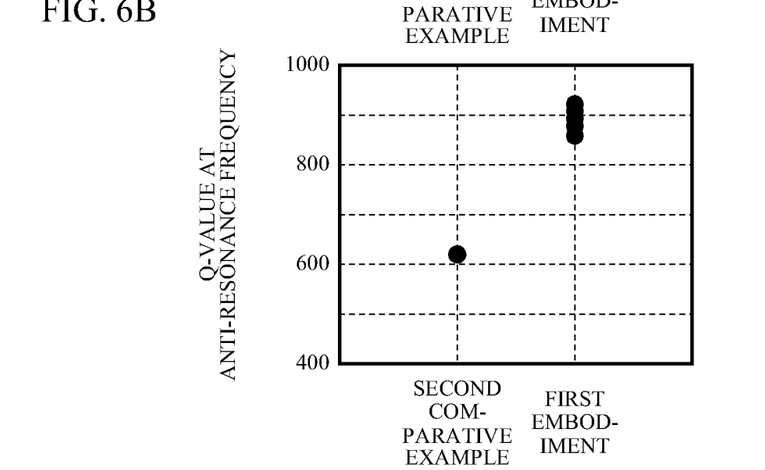
Figure 6C:
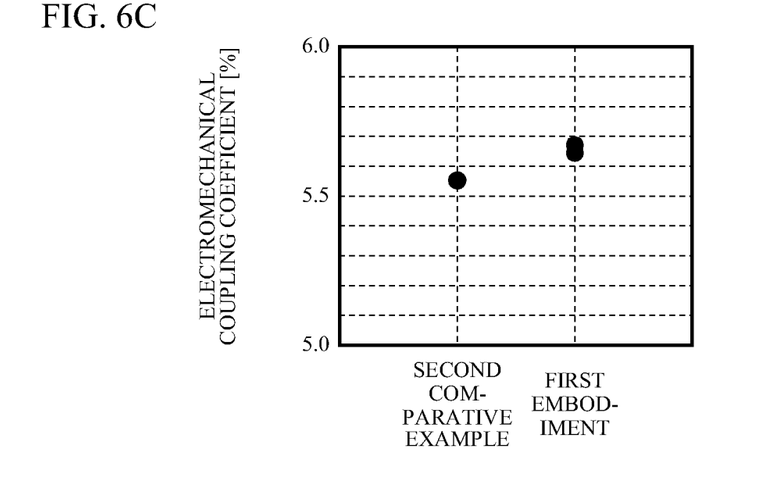

FIG. 6A through FIG. 6C show simulation results illustrating a Q-value at the resonance frequency, a Q-value at the anti-resonance frequency, and the electromechanical coupling coefficient respectively. As illustrated in FIG. 6A through FIG. 6C, in the resonator in accordance with the first embodiment, compared to the resonator in accordance with the second comparative example, the Q-value at the resonance frequency, the Q-value at the anti-resonance frequency and the electromechanical coupling coefficient are improved. This is because in the first embodiment since the outer periphery 51 of the piezoelectric film 14b is positioned further in than the outer periphery 53 of the upper electrode 16, the leakage of the acoustic wave in the piezoelectric film 14b to the further out than of the resonance region 50 is suppressed.

Figure 7A:
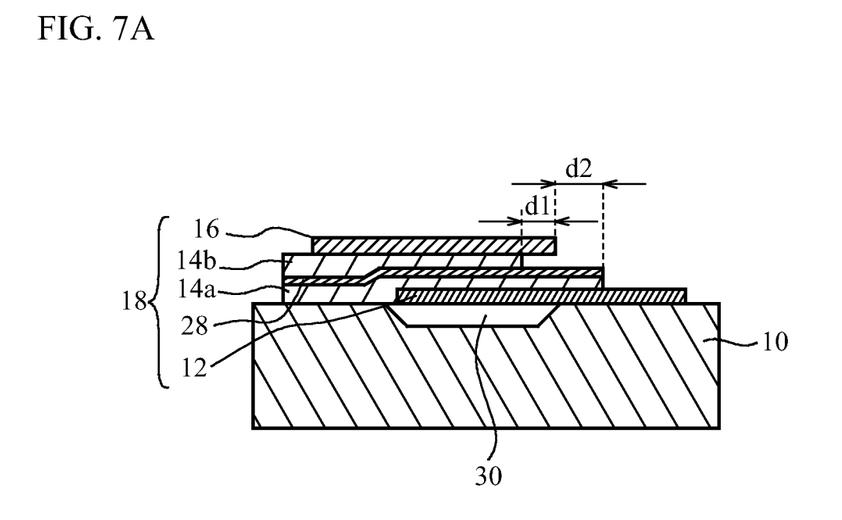
FIG. 7A and FIG. 7B are cross-sectional views of a first modified embodiment and a second modified embodiment of the first embodiment respectively.
Figure 7B:
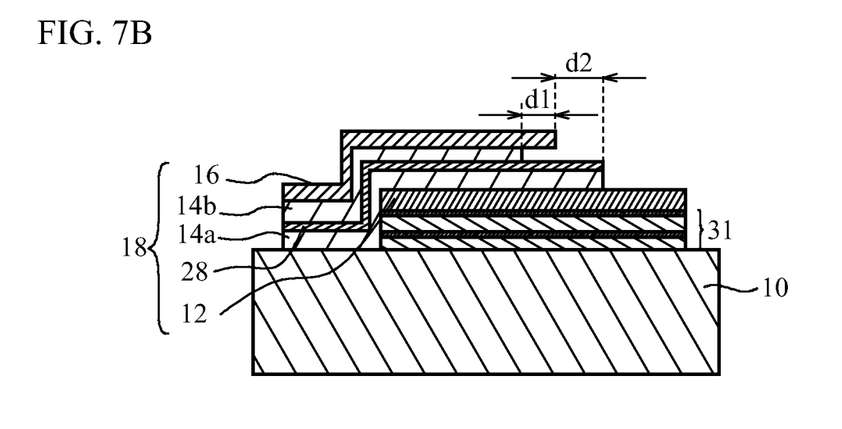

A description will be given of a modified embodiment of the first embodiment. FIG. 7A and FIG. 7B are cross-sectional views of a first modified embodiment and a second modified embodiment of the first embodiment respectively. As illustrated in FIG. 7A, a recess may be formed in a top surface of the substrate 10, and the space 30 may be formed by the recess. In addition, the space 30 may be a penetration hole which penetrates through the substrate. As illustrated in FIG. 7B, instead of the space 30, an acoustic reflection film 31 may be used. The acoustic reflection film 31 may use a film in which a film having a high acoustic impedance and a film having a low acoustic impedance are alternately stacked with a film thickness of a wavelength of the acoustic wave. This enables the acoustic reflection film 31 to reflect a longitudinal acoustic wave.

According to the first embodiment and its modified embodiments, the outer periphery 51 of the piezoelectric film 14b in the region 52 is positioned further in than the outer periphery 53 of the upper electrode 16. As illustrated in FIG. 6A through FIG. 6C, this enables to improve resonance characteristics.

It is sufficient if at least two piezoelectric films 14a and 14b are formed on the lower electrode 12. It is sufficient if the insulating film 28 is located between at least two piezoelectric films 14a and 14b. In this case, it is sufficient if the outer periphery 51 of the uppermost piezoelectric film 14b out of at least two piezoelectric films in the region 52 is positioned further in than the outer periphery 53 of the upper electrode 16.

In addition, in the region of the outer periphery 53 of the upper electrode 16 where the outer periphery 51 of the piezoelectric film 14b is positioned further in than the outer periphery 53 of the upper electrode 16, the outer periphery 55 of the piezoelectric film 14a is positioned further out than the outer periphery 53 of the upper electrode 16. This enables to secure the strength of the multilayered film 18 compared to a case where the outer periphery 55 of the piezoelectric film 14a is positioned further in than the outer periphery 53 of the upper electrode 16. When at least two piezoelectric films are formed, it is sufficient if the outer periphery of the lowermost piezoelectric film out of the at least two piezoelectric films is positioned further out than the outer periphery 53 of the upper electrode 16.

It is preferable that the outer periphery of the space 30 or acoustic reflection film 31 is positioned further out than the outer periphery 53 of the upper electrode 16. According to this, as the resonance region 50 is included in the space 30, resonance characteristics are improved.

As described in the first embodiment, when the space 30 is provided below the lower electrode 12, it is preferable that in the region where the outer periphery 51 of the piezoelectric film 14b is formed further in than the outer periphery 53 of the upper electrode 16, the outer periphery of the space 30 is positioned further out than the outer periphery 53 of the upper electrode 16, and positioned further in than the outer periphery 55 of the piezoelectric film 14a. This enables to improve resonance characteristics by positioning the outer periphery 51 further in than the outer periphery 53. In addition, in a case where the space 30 is provided, although the strength of the multilayered film 18 tends to be weak, the strength of the multilayered film 18 can be made strong by positioning the outer periphery 55 further out than the outer periphery of the space 30.

In addition, it is preferable that the insulating film 28 has a temperature coefficient of an elastic constant which is opposite in sign to those of at least two piezoelectric films 14a and 14b. This enables to make the temperature dependence of a frequency such as a resonance frequency small. As such materials, at least two piezoelectric films 14a and 14b may mainly include aluminum nitride, and the insulating film 28 may mainly include oxide silicon.

In the first embodiment and its modified embodiments, the outer periphery 55 of the piezoelectric film 14a almost coincides with the outer periphery of the insulating film 28, but the outer periphery of the insulating film 28 may almost coincide with the outer periphery 51 of the piezoelectric film 14b. In addition, the outer periphery of the insulating film 28 may be positioned between the outer periphery 51 of the piezoelectric film 14b and the outer periphery 55 of the piezoelectric film 14a.

In the first embodiment and its modified embodiments, edge portions of outer peripheries 55 and 51 of piezoelectric films 14a and 14b are parallel in the film thickness direction of piezoelectric films 14a and 14b, but edge portions of outer peripheries 55 and 51 may be tilted in the film thickness direction of piezoelectric films 14a and 14b. In this case, it is sufficient if the innermost side of the edge portion of the outer periphery 51 of the piezoelectric film 14b is positioned further in than the edge portion of the outer periphery 53 of the upper electrode 16. Especially, it is preferable that the position where the edge portion of the outer periphery 51 of the piezoelectric film 14b contacts the upper electrode 16 is positioned further in than the edge portion of the outer periphery 53 of the upper electrode 16.

Second Embodiment

Figure 8A:
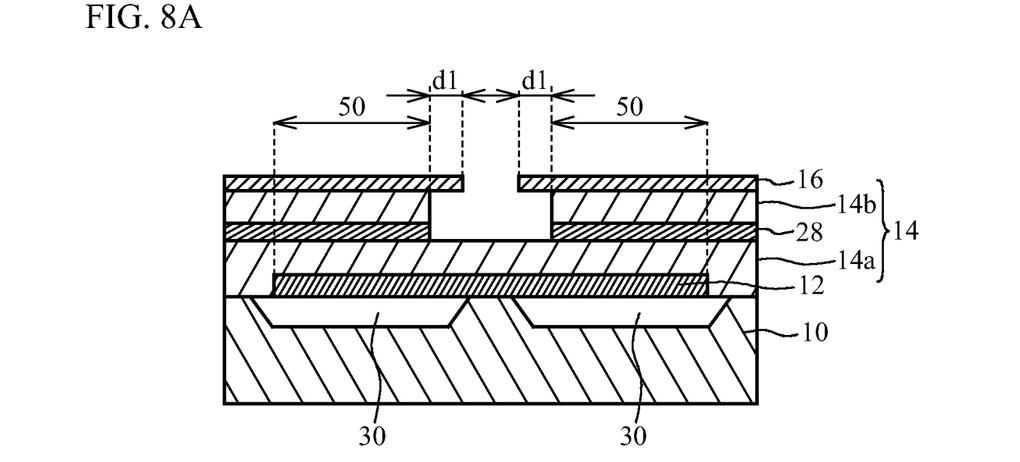
FIG. 8A through FIG. 8C are cross-sectional views of a resonator in accordance with a second embodiment.
Figure 8B:
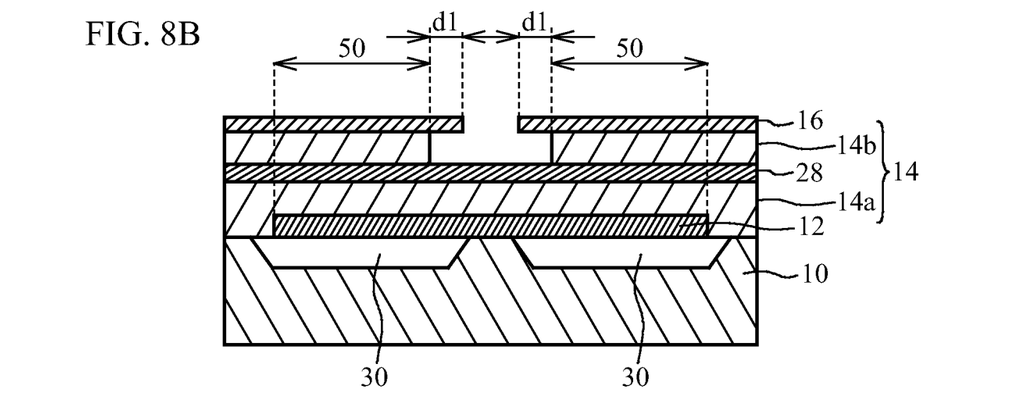
Figure 8C:
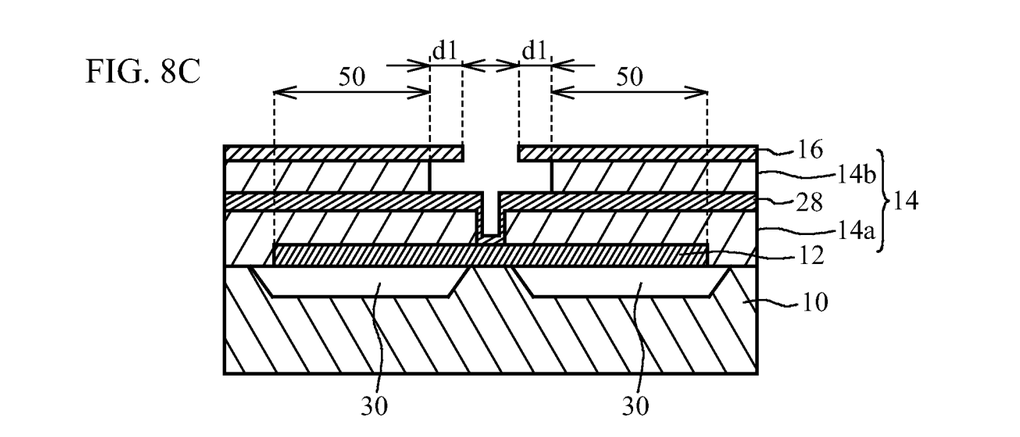

A second embodiment is an example where a number of resonators are formed on the substrate like a filter. FIG. 8A through FIG. 8C are cross-sectional views of a resonator in accordance with the second embodiment. In FIG. 8A through FIG. 8C, two resonators are formed on the substrate 10. A recess is provided to the substrate 10, and the recess functions as the space 30. The lower electrode 12, the piezoelectric film 14a, the insulating film 28, the piezoelectric film 14b and the upper electrode 16 are formed on the substrate 10 via the space 30. Two resonance regions 50 where the upper electrode 16 and the lower electrode 12 face each other across the piezoelectric film 14 are provided.

In the example of FIG. 8A, the piezoelectric film 14a is continuously formed between resonance regions 50, and the insulating film 28 is not formed. In the example of FIG. 8B, the piezoelectric film 14a and the insulating film 28 are continuously formed between resonance regions 50. In the example of FIG. 8C, the piezoelectric film 14a is not continuously formed between resonance regions 50, but the insulating film 28 is continuously formed.

As shown in the second embodiment, when resonators are formed on the substrate 10, lower electrodes 12 of resonators may be connected each other, and piezoelectric films 14a (lowermost piezoelectric films) and/or insulating films 28 (insulating films located on lowermost piezoelectric films) may be connected each other on lower electrodes 12 connected each other. This enables to form resonators close to each other, and to reduce the size of the chip. The lower electrode 12 and at least one of the piezoelectric film 14a and the insulating film 28 are formed in the outer periphery part of the space 30, and the strength of the multilayered film 18 can be made to be strong.

In addition, it is preferable that insulating films 28 are formed on lower electrodes 12 connected each other so that they are connected each other. This enables to improve the resistance to electrostatic discharge failure.

Third Embodiment

Figure 9:
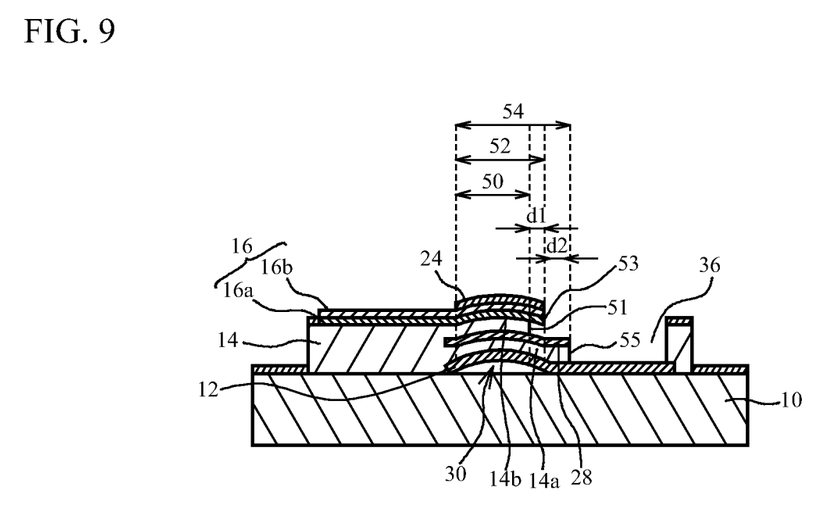
FIG. 9 is a cross-sectional view of a resonator in accordance with a third embodiment.

FIG. 9 is a cross-sectional view of a resonator in accordance with a third embodiment. As shown in FIG. 9, the insulating film 28 is not formed between the upper electrode 16 and the substrate 10 which are located in at least a part of the region in which the upper electrode 16 is formed and the lower electrode 12 is not formed. When a bump is formed on the upper electrode 16 located in the region where the insulating film 28 is not formed, and a flip-chip bonding is performed, or when a bonding wire is connected, it is possible to suppress the exfoliation of the insulating film 28 and the piezoelectric film 14.

Fourth Embodiment

Figure 10:
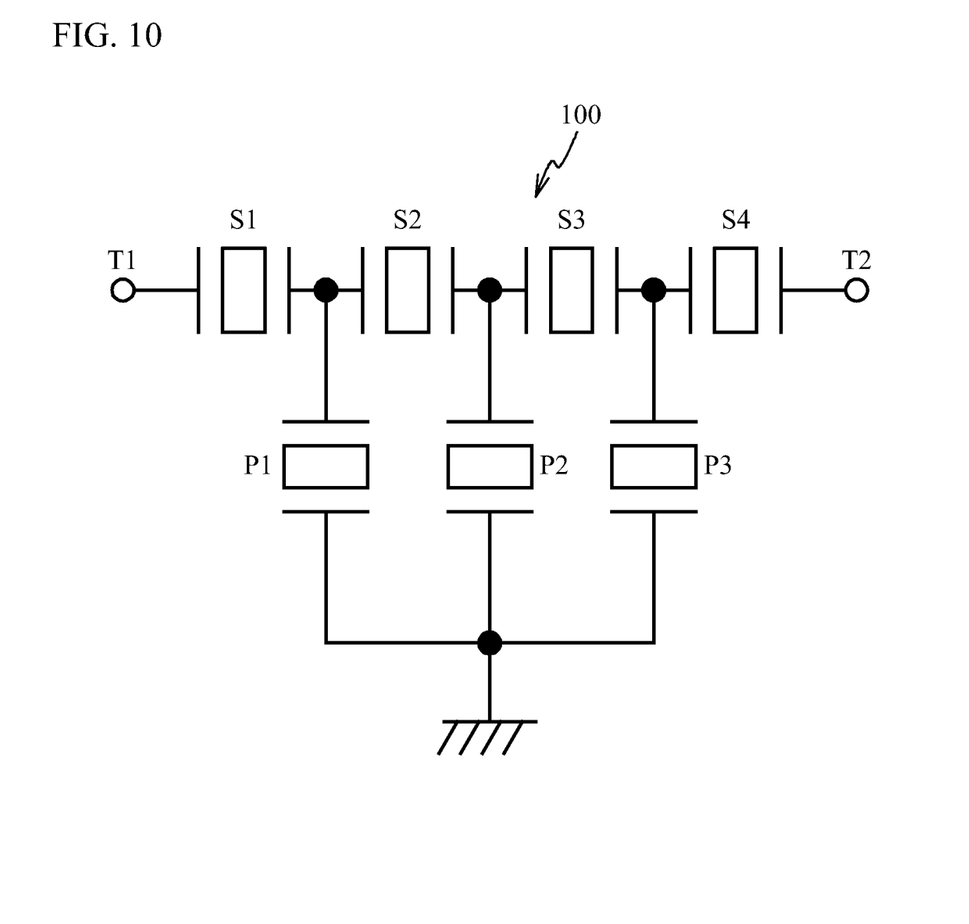
FIG. 10 is a circuit diagram illustrating a ladder-type filter in accordance with a fourth embodiment.

A fourth embodiment is an example using the resonator in accordance with first through third embodiments to a filter as an acoustic wave device. FIG. 10 is a circuit diagram illustrating a ladder-type filter in accordance with the fourth embodiment. As illustrated in FIG. 10, a ladder-type filter 100 is provided with series resonators Si through S4 and parallel resonators P1 through P3. Series resonators Si through S4 are connected in series between input-output terminals T1 and T2. Parallel resonators P1 through P3 are connected in parallel between input-output terminals T1 and T2. At least one of series resonators Si through S4 and parallel resonators P1 through P3 can be the resonator described in first through third embodiments.

Figure 11:
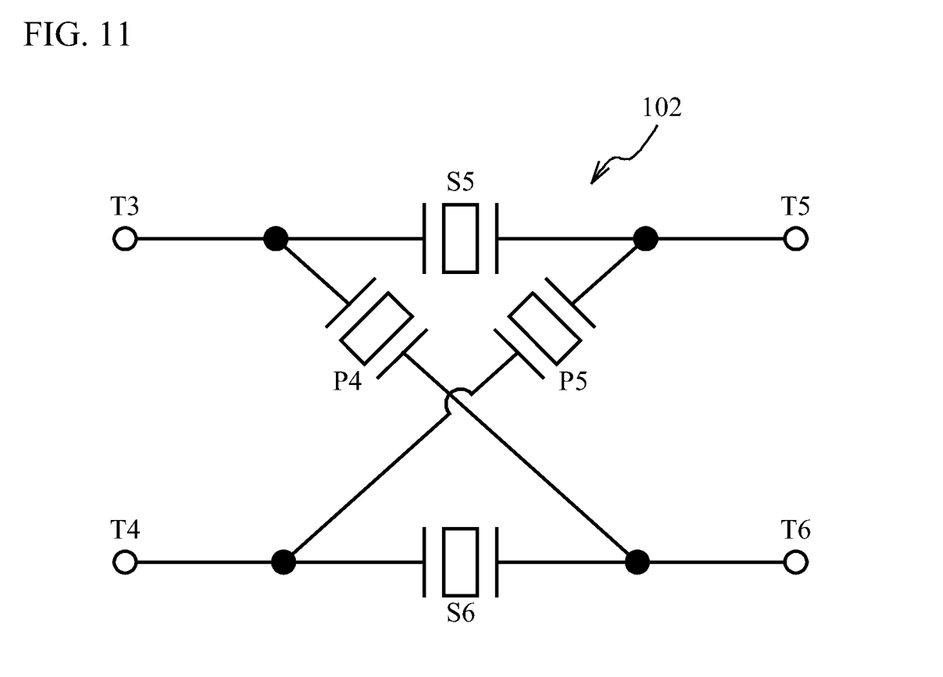
FIG. 11 is a circuit diagram illustrating a lattice-type filter in accordance with the fourth embodiment.

FIG. 11 is a circuit diagram illustrating a lattice-type filter in accordance with the fourth embodiment. A lattice-type filter 102 is provided with series resonators S5 and S6, and parallel resonators P4 and P5. The series resonator S5 is connected between terminals T3 and T5, and the series resonator S6 is connected between terminals T4 and T6. The parallel resonator P4 is connected between terminals T3 and T6, and the parallel resonator P5 is connected between terminals T4 and T5. Resonators described in first through third embodiments can be used as the series resonator and the parallel resonator of such lattice-type filter 102. According to the fourth embodiment, it is possible to improve characteristics of the filter.

Fifth Embodiment

Figure 12:
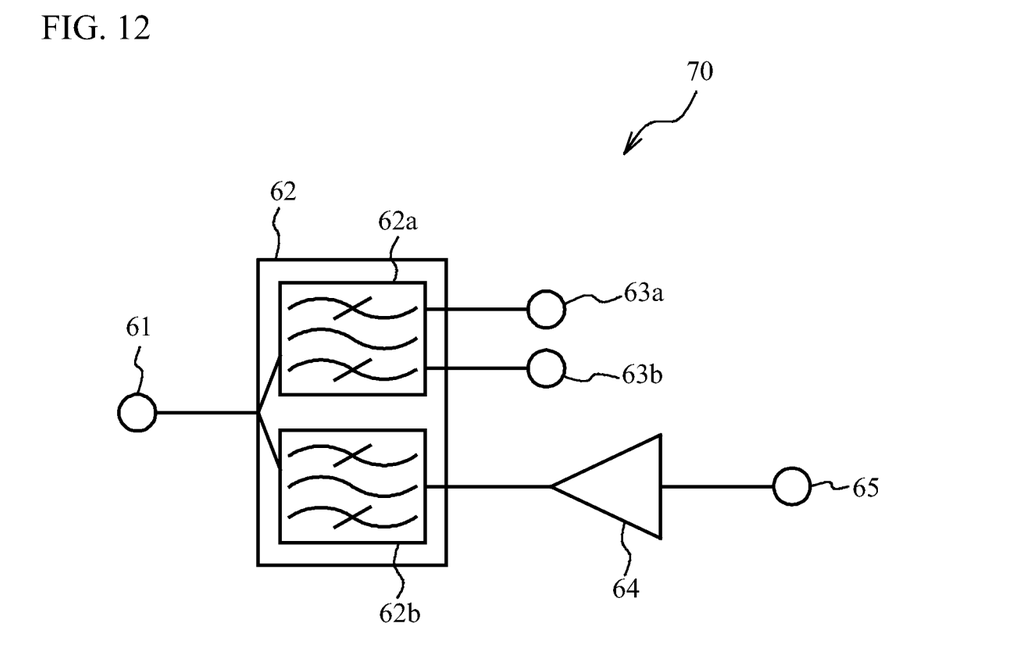
FIG. 12 is a block diagram of a module in accordance with a fifth embodiment.

A fifth embodiment is an example of an RF (Radio Frequency) module for mobile communication. FIG. 12 is a block diagram of a module in accordance with the fifth embodiment. As illustrated in FIG. 12, the module 70 is provided with a duplexer 62 and a power amplifier 64. The duplexer 62 includes a reception filter 62a and a transmission filter 62b. The reception filter 62a is connected between an antenna terminal 61 and reception terminals 63a and 63b. The reception filter 62a passes signals in the reception band out of signals input from the antenna terminal 61, and suppresses other signals. Signals in the reception band are output from reception terminals 63a and 63b. Balanced signals are output from reception terminals 63a and 63b. The transmission filter 62b is connected between the power amplifier 64 and the antenna terminal 61. The transmission filter 62b passes signals in the transmission band out of signals input from the power amplifier 64, and suppresses other signals. Signals in the transmission band are output from the antenna terminal 61. The power amplifier 64 amplifies signals input from the transmission terminal 65, and outputs them to the transmission filter 62b. At least one of reception filters 62a and transmission filter 62b can include the filter of the fourth embodiment.

When the reception filter 62a is composed of a longitudinally coupled double-mode surface acoustic wave filter, the output of which the phase is shifted by 180° can be obtained by only changing the position of the electrode finger, and the balanced output can be easily obtained. When the transmission filter 62b uses a filter in which at least one of or preferably all of piezoelectric thin film resonators described in the first embodiment are connected in a ladder shape, it is possible to make the Q-value higher than that of the surface acoustic wave filter, and obtain the filter having low-loss, high suppression, and high power durability. Therefore, when the duplexer 62 uses a double-mode filter composed of the surface acoustic wave filter for the reception filter 62a, and uses a filter in which piezoelectric thin film resonators in accordance with first through third embodiments are connected in a ladder shape for the transmission filter 62b, it is possible to obtain a balanced output on the reception side and the filter having low-loss, high suppression, and high power durability on the transmission side.

In the fifth embodiment, although descriptions were given by using the RF module as an example, acoustic wave devices in accordance with first through fourth embodiments may be used for other modules.

Although the embodiments of the present invention have been described in detail, it should be understood that the various change, substitutions, and alterations could be made hereto without departing from the spirit and scope of the invention.

What is claimed is:

1. An acoustic wave device comprising:
a substrate;
a lower electrode formed on the substrate;
at least two piezoelectric films formed on the lower electrode;
an insulating film located between the at least two piezoelectric films; and
an upper electrode formed on the at least two piezoelectric films,
wherein outer peripheries of upper and lower surfaces of an uppermost piezoelectric film out of the at least two piezoelectric films in a region in which the lower electrode and the upper electrode face each other are positioned further in than an outer periphery of the upper electrode,
wherein in a region in which the outer peripheries of the upper and lower surfaces of the uppermost piezoelectric film are positioned further in than the outer periphery of the upper electrode, outer peripheries of upper and lower surfaces of a lowermost piezoelectric film out of the at least two piezoelectric films are positioned further out than the outer periphery of the upper electrode; and
wherein no electrode is formed between the lower electrode and the upper electrode.

2. The acoustic wave device according to claim 1, wherein a space or an acoustic reflection film are provided below the lower electrode, and
in the region in which the outer peripheries of the upper and lower surfaces of the uppermost piezoelectric film are positioned further in than the outer periphery of the upper electrode, an outer periphery of the space or an outer periphery of the acoustic reflection film is positioned further out than the outer periphery of the upper electrode.

3. The acoustic wave device according to claim 1, wherein a space is provided below the lower electrode, and
in the region in which the outer peripheries of the upper and lower surfaces of the uppermost piezoelectric film are positioned further in than the outer periphery of the upper electrode, an outer periphery of the space is positioned further out than the outer periphery of the upper electrode, and is positioned further in than the outer peripheries of the upper and lower surfaces of the lowermost piezoelectric film.

4. The acoustic wave device according to claim 1, wherein the insulating film has a temperature coefficient of an elastic constant which is opposite in sign to those of the at least two piezoelectric films.

5. The acoustic wave device according to claim 1, wherein the at least two piezoelectric films are two piezoelectric films, and the insulating film is one insulating film.

6. The acoustic wave device according to claim 1, wherein the at least two piezoelectric films mainly include aluminum nitride, and the insulating film mainly includes silicon oxide.

7. The acoustic wave device according to claim 1, further comprising:
   acoustic wave resonators including the acoustic wave device according to claim 1, wherein
   the lower electrodes of the acoustic wave resonators are connected to each other, and the lowermost piezoelectric films of the acoustic wave resonators are connected each other and/or the insulating films of the acoustic wave resonators are connected to each other.

8. An acoustic wave device comprising:
   a reception filter which outputs a balanced output by a longitudinally coupled double-mode surface acoustic wave filter; and
   a transmission filter in which acoustic wave resonators including at least one acoustic wave device according to claim 1 are connected in a ladder shape.

9. An acoustic wave device comprising:
   a substrate;
   a lower electrode formed on the substrate;
   at least two piezoelectric films formed on the lower electrode;
   an insulating film located between the at least two piezoelectric films; and
   an upper electrode formed on the at least two piezoelectric films,
   wherein an outer periphery of an uppermost piezoelectric film out of the at least two piezoelectric films in a region in which the lower electrode and the upper electrode face each other is positioned further in than an outer periphery of the upper electrode, and
   wherein the insulating film is not formed between the upper electrode and the substrate which are located in at least a part of a region in which the upper electrode is formed and the lower electrode is not formed.

* * * * *